United States Patent
Butler (10) Patent No.: US 7,084,958 B2
(45) Date of Patent: Aug. 1, 2006

(54) LITHOGRAPHIC APPARATUS, CONTROL SYSTEM AND DEVICE MANUFACTURING METHOD

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 164 days.

(21) Appl. No.: 10/823,776

(22) Filed: Apr. 14, 2004

(65) Prior Publication Data

US 2005/0231699 A1    Oct. 20, 2005

(51) Int. Cl.
*G03B 27/52*    (2006.01)
*G03B 27/42*    (2006.01)

(52) U.S. Cl. .......................... 355/55; 355/53
(58) Field of Classification Search ............. 355/53, 355/55, 72–76; 700/45, 63; 318/592, 594
See application file for complete search history.

(56) References Cited

U.S. PATENT DOCUMENTS 6,163,366 A    12/2000 Okamoto et al.
6,490,025 B1 *    12/2002 Makinouchi et al. ........ 355/53
6,633,363 B1    10/2003 Makinouchi
2005/0128460 A1 *    6/2005 Van Den Biggelaar et al. .. 355/72

OTHER PUBLICATIONS

European Search Report issued in EP Application No. 05075859.8 dated Aug. 12, 2005.

* cited by examiner

*Primary Examiner*—Henry Hung Nguyen
(74) *Attorney, Agent, or Firm*—Pillsbury Winthrop Shaw Pitman, LLP (57) ABSTRACT

A lithographic apparatus includes an illumination system configured to provide a beam of radiation; a support configured to support a patterning device, the patterning device configured to impart the beam with a pattern in its cross-section; a substrate table configured to hold a substrate; a projection system configured to project the patterned beam onto a target portion of the substrate; a measurement system configured to generate an information signal including information about positions of at least one of the patterning device, the substrate, the projection system, and components therein; and a control system configured to control the positions.

15 Claims, 12 Drawing Sheets

LITHOGRAPHIC APPARATUS, CONTROL SYSTEM AND DEVICE MANUFACTURING METHOD

BACKGROUND OF THE INVENTION

1. Field of the Invention

The present invention relates to a lithographic apparatus, a control system, and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

The control system of the known lithographic apparatus controls and operates directly on conventional coordinates such as determined positions (note that in this application the term position can include the orientation of a moveable object of the lithographic apparatus [so one position can include six degrees of freedom]). Furthermore, it is noted that the control system can include a plurality of sub-control systems, wherein each sub-control system is configured to control a position of one of the moveable objects. Examples of relevant moveable objects of the lithographic apparatus are: lens elements, the substrate table with the substrate, the reticle stage with the reticle, etc.

Currently, desired imaging characteristics like focus, magnification, distortion, etc. expressed in native coordinates are translated into conventional setpoints in conventional coordinates (positional/spatial coordinates) for the relevant moveable objects of the lithographic apparatus by means of the inverse of a known sensitivity matrix. Next, the thus determined conventional setpoints are compared with components of the information signal (also expressed in conventional coordinates) which yields conventional error signals to be fed to a conventional controller. Generally, each conventional error signal is fed to a corresponding and unique conventional controller for generating a control signal (in a conventional coordinate) for controlling the corresponding element of the lithographic apparatus. This means that a position error in one of the elements can be solved only by the unique (local) controller for this object of the lithographic apparatus.

In the conventional control system the relation between the position of the lens element and the stages, and the imaging characteristics, is known. In other words, if the positions of these objects is known, the effect on focus, magnification, etc. can be calculated. Now, if a change in the imaging characteristics is required, a desired position for each individual object can be calculated. These desired positions function as a setpoint for the various unique and local control loops, which means that each of the objects to be positioned has its own control loop. This conventional scheme has some drawbacks.

A first drawback is that if one of the moveable objects gets disturbed, the control loop of this object has to correct the situation all by itself. For example, if one of the lens elements gets disturbed but happens to have a low servo bandwidth, it takes some time before the imaging characteristics are back to their optimal value.

A second drawback is that if a setpoint change occurs for one of the imaging characteristics (e.g., focus), this change results in a setpoint change for all elements that have an effect on focus. Because not all elements react with the same speed, disturbances on other imaging characteristics that do not have a setpoint change occur.

SUMMARY OF THE INVENTION

It is an aspect of the present invention to relieve the drawbacks of the conventional control system. In particular, it is an aspect of the present invention to provide a lithographic apparatus provided with a control system configured for a desired or an optimal exposure function, thus yielding desired or optimized imaging characteristics of a device manufactured by the lithographic apparatus.

The aspect is achieved with a lithographic apparatus according to the present invention wherein the lithographic apparatus is configured to transform an information signal into at least a native feedback signal representing an imaging characteristic such as focus, magnification and/or distortion, wherein the control system includes a native controller arranged to generate a control signal on the basis of a native set-point signal and the native feedback signal, and wherein the control system is configured to control the positions on the basis of the control signal.

An aspect of the invention is that 'fast' lens elements (elements that can be positioned with relative high accuracy at a desired position in a relative short time) of the lithographic apparatus can compensate, for example, for errors in 'slow' lens elements. Note that if the number of imaging characteristics equals the number of adjustable elements, generally only one setting of these elements corresponds to a situation wherein the imaging characteristics are desired or optimal. However, if one element gets disturbed, a compromise could be found that involves an undesired or a sub-optimum. For example, if a lens element gets disturbed and as a result focus deviates a large amount from its desired value, another lens element could compensate for this at the cost of a somewhat higher distortion. If focus is considered more desired or important than distortion, such a compensation is favorable. Furthermore, setpoint changes in a native coordinate (e.g., focus) can be followed with zero error in the other co-ordinates (e.g., magnification, distortion) in the case wherein a MIMO controller is used. The latter will be explained in more detail later in this application.

It is noted that the present invention also relates to a control system including a native controller suitable for a lithographic apparatus according to the present invention and a device manufacturing method for manufacturing a device.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned.

The support supports, e.g., bears the weight of, the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
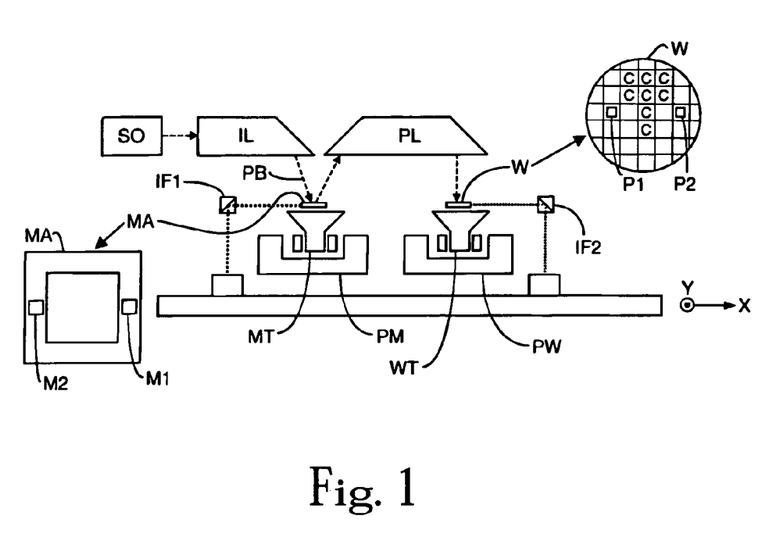
FIG. 1 depicts a lithographic apparatus according to an embodiment of the present invention.

FIG. 1 schematically depicts a lithographic apparatus according to an exemplary embodiment of the invention. The apparatus includes an illumination system (illuminator) IL configured to provide a beam PB of radiation (e.g., UV or EUV radiation). A first support (e.g., a mask table) MT supports a patterning device (e.g., a mask) MA and is connected to a first positioning device PM that accurately positions the patterning device with respect to a projection system ("lens") PL. A substrate table (e.g., a wafer table) WT holds a substrate (e.g., a resist-coated wafer) W and is connected to a second positioning device PW that accurately positions the substrate with respect to the projection system PL. The projection system (e.g. a reflective projection lens) PL images a pattern imparted to the beam PB by the patterning device MA onto a target portion C (e.g., including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector including, for example, suitable collecting mirrors and/or a spectral purity filter. In other cases the source may be integral part of the apparatus, for example when the source is a mercury lamp. The source SO and the illuminator IL, may be referred to as a radiation system.

The illuminator IL may include an adjusting device that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation having a desired uniformity and intensity distribution in its cross-section.

The beam PB is incident on the mask MA, which is held on the mask table MT. Being reflected by the mask MA, the beam PB passes through the lens PL, which focuses the beam onto a target portion C of the substrate W. With the aid of the second positioning device PW and a position sensor IF2 (e.g., an interferometric device), the substrate table WT can be moved accurately, e.g. so as to position different target portions C in the path of the beam PB. Similarly, the first positioning device PM and a position sensor IF1 (e.g., an interferomtric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus shown in FIG. 1 also includes a measurement system that generates an information signal 2 (schematically indicated in FIG. 2) including information about the positions (mutual spatial orientation or configuration) of the illumination system IL, elements in the illumination system IL, the support that supports the patterning device, the patterning device MA, the substrate table that supports the substrate, the substrate WT and/or the projection system PL and/or elements in the projection system. The measurement system includes the position sensors IF2 and IF1 which generate respective position signals representing the respective positions of the substrate W (wafer) and the mask MA (mask).

Furthermore, the lithographic apparatus includes a control system 1 that controls the mutual spatial orientation on the basis of at least the information signal 2.

Important imaging characteristics of the exposed reticle image on the wafer, for example, focus, magnification, distortion, etc., are generally corrected by adjusting the position of elements in the projection system PL (lens), together with adjustment of positions of the reticle stage and wafer stage. For example, before exposure of a wafer starts, the focus, magnification, distortion, etc. could be determined by transformation of measurements performed by (a combination of) conventional alignment system(s). Then, the position of lens elements together with the stages could be adjusted such that these imaging parameters are optimal. Generally, the vertical positions are considered here: Z, Rx, Ry, wherein Z is a vertical position, Rx is a rotation about a first horizontal axis, and Ry is a rotation about a second horizontal axis perpendicular to the first horizontal axis.

Lens heating effects lead to variations in the mentioned imaging characteristics. By modeling the effect of lens heating, at the start of each exposure, correction of focus, magnification, etc. can be calculated that minimize the effect of lens heating on the imaging characteristics.

One aspect of the invention lies in transforming conventional coordinates (in which the signals such as measurement signals are expressed) into so-called 'native' coordinates (imaging coordinates such as focus, magnification, etc). The basic concept is explained hereinafter with reference to FIG. 2.

Figure 2:
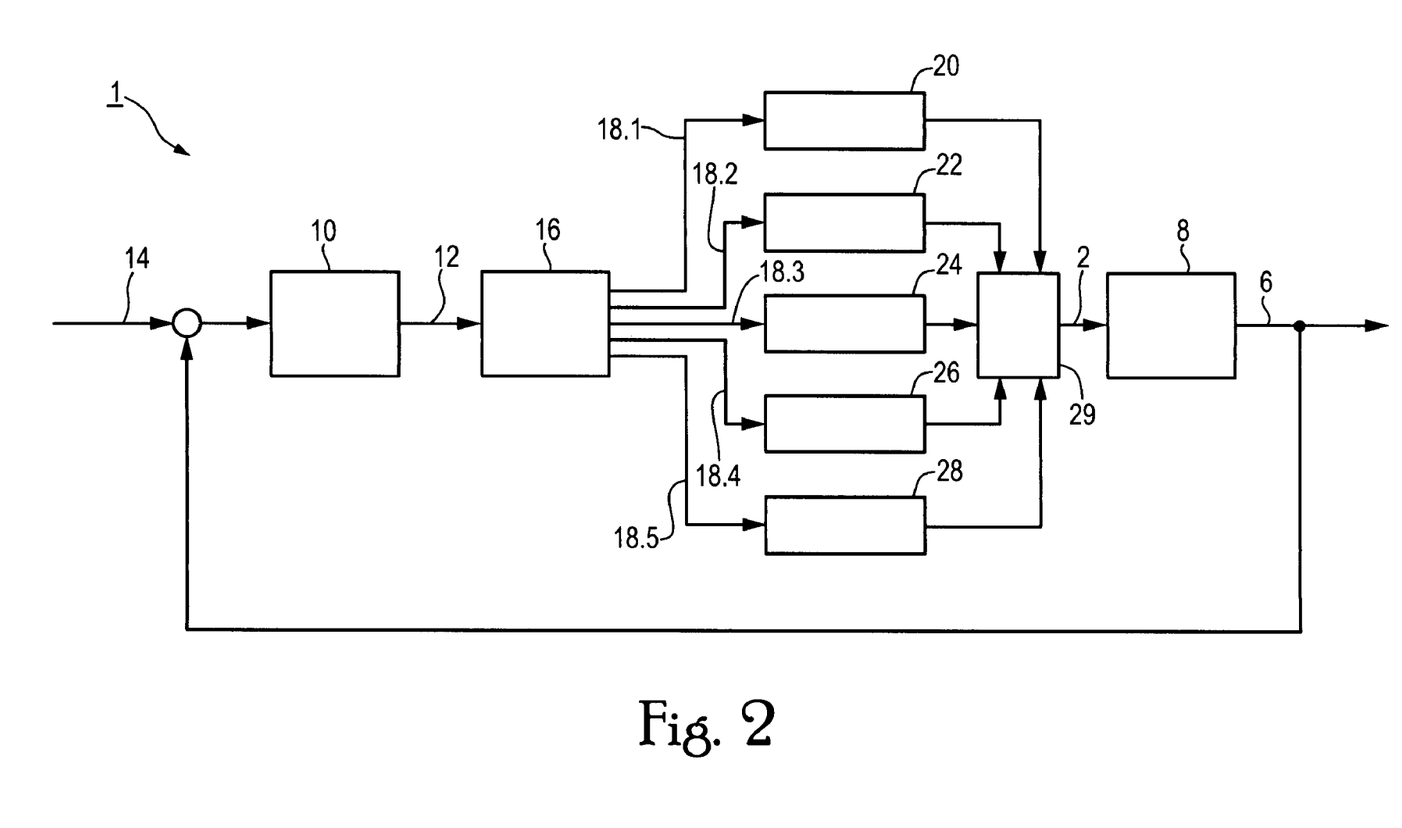
FIG. 2 shows a schematic overview of a control system according to the present invention.

The control system 1 in FIG. 2 is arranged to transform the information signal 2 into at least a native feedback signal 6. The native feedback signal 6 can be an imaging parameter such as a focus, a magnification or a distortion signal (or any combination thereof). In this example the control system 1 includes a separate transformation unit 8 that performs the transformation from the information signal 2 into the native feedback signal 6.

The control system 1 includes a native controller 10 configured to generate a control signal 12 on the basis of the native feedback signal 6 and a native set-point signal 14. The control signal is fed to an inverse transformation unit 16 that generates a set of respective controller drive signals 18.1, 18.2, 18.3, 18.4 and 18.5 representing values of respective drive forces to be fed to respective drive units of a reticle stage 20, a first lens element 22, a second lens element 24, a third lens element 26 and a wafer stage 28. The resulting positions of the various elements are measured by the measurement system 29 which generates the measurement signal 2 including the determined (in this case measured) positions of the reticle stage 20, wafer stage 28, and lens elements 22, 24, 26. According to an exemplary embodiment, each moveable object has its own measurement subsystem which measures the position of the object in one or more dimensions (certain directions and/or orientations).

In this way, the control system 1 is arranged to control the positions of the stages 20, 28 and the lens elements 22, 24, 26 on the basis of the control signal 12.

Hereafter a more detailed discussion is provided wherein two different basic concepts are discussed. First an architecture where (a) 'native' controller(s) replace(s) (a) conventional position controller(s) is presented. Thereafter, an architecture is described wherein the original position controllers are appended by an extra set of native controllers.

Figure 3:
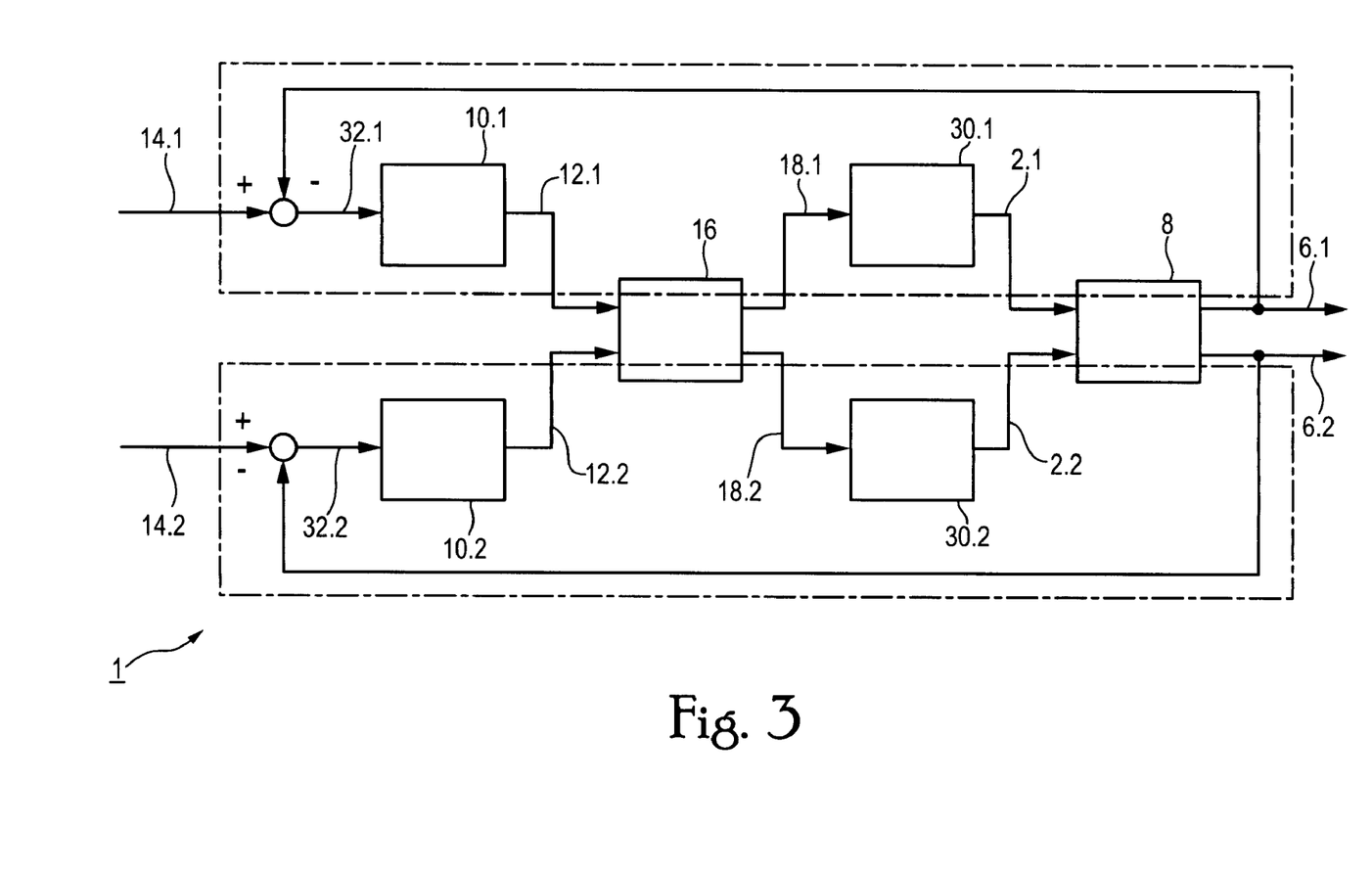
FIG. 3 schematically shows a SISO native controller in a control system according to the present invention.

FIG. 3 shows a control system 1 which includes two native SISO (Single-In-Single-Out)-controllers 10.1 and 10.2. Each controller 10.$i$ generates a control signal 12.$i$ ($i=1, 2$). The control signals are fed to the transformation unit 16 that generates two respective drive signals (for example force signals) 18.1 and 18.2 for driving two respective lens elements 30.$i$ ($i=1, 2$). The lens elements 30.$i$ ($i=1,2$) are displaced as a result of the relevant drive forces acting on the elements. The measurement system measures the displacements and generates a position signal 2.$i$ ($i=1, 2$) including information of the positions of the lens elements. This results in this case in two position signals which together form the information (or measurement) signal. The measurement signal is fed to transformation unit 8 which calculates a feedback signal including a first native signal 6.1 in a first native coordinate and a second native signal 6.2 in a second native coordinate. The respective feedback signals 6.$i$ are fed back and are subtracted from the respective native setpoint signals 14.$i$ ($i=1,2$), the latter results in respective native error signals 32.$i$ ($i=1,2$). The error signals can represent a focus error, magnification error, etc. These errors form the inputs of the respective controllers 10.$i$ ($i=1,2$). Each controller deals with one of these 'native' coordinates by generating a control signal in this native coordinate.

The transformation unit 8 can use a matrix T for transforming the (conventional) two-dimensional vector-position-signal (including the position components 2.1 and 2.2) for calculating the two-dimensional vector feedback signal (including the components 6.1 and 6.2 in native coordinates).

The controller output (in this example the two-dimensional vector control signals 12.1 and 12.2) is transformed by unit 16 into controller forces (in this case the two-dimensional vector signals 18.1 and 18.2) by the matrix $T^{-1}$. Various forms of this idea can be worked out, as will be shown later in this application.

As a further explanation of the control aspects, the example of FIG. 3 will be elaborated now in more detail. The mechanics of the two respective systems (for example, two lens elements 30.1 and 30.2) is denoted as respectively $L_1$ and $L_2$, the corresponding respective controllers 10.1 and 10.2 are denoted as $C_{L1}$ and $C_{L2}$. In this example, focus and magnification are the two imaging parameters to be controlled. Furthermore, it is assumed that the objects to be controlled are described by a moveable mass only (no additional dynamics). The relation between the position $y_i$ of the lens element 30.$i$ ($i=1, 2$) and the applied control force $F_i$ corresponding to the drive signals 18.$i$ ($i=1, 2$) is:

$$y_i = \frac{1}{m_i s^2} F_i.$$

The control principle to be used in this example is the PID control concept with a low-pass filter, that relates its output U to the position error e by:

$$U = Kp\left(1 + \frac{1}{2\pi f_i s}\right)\left(\underset{d}{2\pi fs} + 1\right)\left(\frac{1}{s^2/(2\pi f_{LP})^2 + 2\beta_{LP} s/(2\pi f_{LP}) + 1}\right)e$$

with:

| | |
|---|---|
| Kp | Proportional gain |
| fi | Integrator frequency |
| $F_d$ | Differentiator frequency |
| $f_{LP}$ | Low-pass filter cut-off frequency |
| $\beta_{LP}$ | Low-pass filter damping ratio |

The PID output U is transformed via the transformation matrix $T^{-1}$ (performed by the inverse transformation unit 16) to drive signals 18.*i* (and corresponding forces to be applied to the relevant moveable objects).

The tuning of these parameters depends on the selected bandwidth, using a factor α that determines the setting of the integrator frequency, differentiator frequency and low-pass filter frequency related to the bandwidth $f_{BW}$:

$$Kp = m\frac{(2\pi f_{BW})^2}{\alpha}$$

$$f_i = f_d = \frac{f_{BW}}{\alpha}$$

$$f_{LP} = f_{BW} \cdot \alpha$$

Note that the integrator frequency is relatively high (conventionally this is chosen smaller than the differentiator frequency, but to improve disturbance rejection it is chosen the same in this example). Further, α is chosen to be 3, and the low-pass filter damping β is chosen 0.7. In this example it is assumed that $L_1$ has a mass of 20 kg, while $L_2$ has a mass of 10 kg. Finally, it is assumed that the $L_1$ control loop has a bandwidth of 25 Hz, while the $L_2$ control loop has a bandwidth of 50 Hz.

Regarding the sensitivity of focus and magnification to lens element positions, a matrix $$T = \begin{bmatrix} 0.8 & 0.2 \\ 0.2 & 0.8 \end{bmatrix}$$

is selected. This implies that both elements have an effect on both focus and magnification.

The controllers 10.1 and 10.2 in the example of FIG. 3 control focus and magnification, respectively. Each controller can be given characteristics that are best suited for each co-ordinate. For example, if focus is considered to be more important than magnification, the focus controller can be given a larger bandwidth than the magnification controller.

Each controller 10.1 and 10.2 'sees' a combination of both lens elements. If the focus controller outputs a corrective force, both lens elements will start moving. However, this also results in a magnification disturbance that has to be dealt with by the magnification controller. This is because the process has now become a non-diagonal multi-input multi-output system:

$$T\begin{bmatrix} L_1 & 0 \\ 0 & L_2 \end{bmatrix} T^{-1} = TLT^{-1}$$

is no longer a diagonal matrix.

Figure 4:
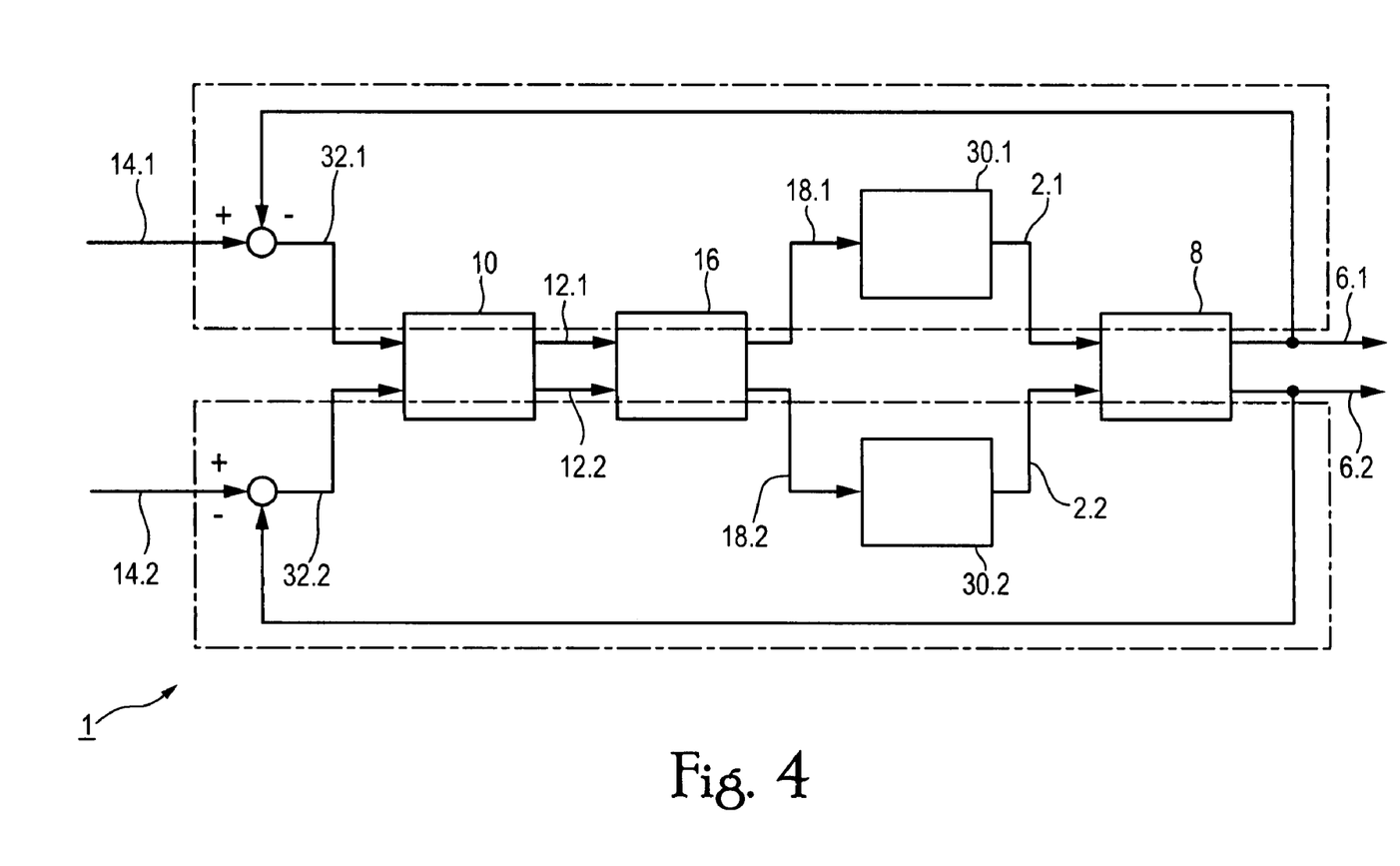
FIG. 4 schematically shows a MIMO native controller in a control system according to the present invention.

FIG. 4 shows a control system 1 which includes a MIMO (Multiple-In-Multiple-Out)-controller 10. The controller 10 generates a control signal including two components 12.*i* (i=1, 2). The control signal is fed to the transformation unit 16 which calculates a drive signal including two components 18.1 (i=1,2).

The MIMO-concept offers the possibility of providing a process corresponding to a diagonal matrix. This prevents cross-talk between the native coordinates. For example, when the focus setpoint is changed, both lens elements will move to a new position such that during the move all other coordinates (e.g., magnification) remain constant.

The controller 10 is indicated in the formulas hereafter as $C_{FM}$ and includes a matrix of four sub-controller:

$$C_{FM} = \begin{bmatrix} c_{11}(s) & c_{12}(s) \\ c_{21}(s) & c_{22}(s) \end{bmatrix}.$$

Only two controllers are required to be designed (focus and magnification); the other two controllers follow from the decoupling demand, namely that the open-loop matrix TLT-$_1C_{FM}$ is diagonal. This matrix is selected to be equal to a to-be-designed diagonal controller matrix S multiplied by the original diagonal process matrix L:

$$TLT^{-1}C_{FM} = LS \Rightarrow C_{FM} = (TLT^{-1})^{-1}LS = TL^{-1}T^{-1}LS$$

S can be the original diagonal matrix involving the separate focus and magnification controller:

$$S = \begin{bmatrix} C_F & 0 \\ 0 & C_M \end{bmatrix}.$$

The controller can be designed for lens mechanical transfer functions $L_1$ and $L_2$, respectively. The above equation then yields $C_{FM}$ that is to be implemented.

Note that when the closed-loop behavior is required to be diagonal instead of the open loop, a similar requirement appears. In this case also, the controller needs to be the multiplication of $TL^{-1}T^{-1}$ and a diagonal matrix (which this time equals $Q(1-Q)^{-1}$, with Q the required closed-loop behavior). Hence, this leads to the same requirements on the controller matrix.

For a good understanding of the present invention, two examples are given wherein simulation results are presented for a specific embodiment:

With reference to FIGS. 5A–F, some simulation results are shown for a first example wherein a 0.1 m stepwise change in the focus setpoint is presented and compared with a conventional situation.

With reference to FIGS. 6A–F, some simulation results are shown for a second example wherein the response to a disturbance force of 1 N on lens element 30.1 is presented and compared with a conventional situation.

In both examples the controller bandwidth for lens element 30.1 is 25 Hz; the bandwidth for lens element 30.2 is 50 Hz; the bandwidth for focus is 25 Hz; and the bandwidth for magnification is 50 Hz.

Figure 5A:
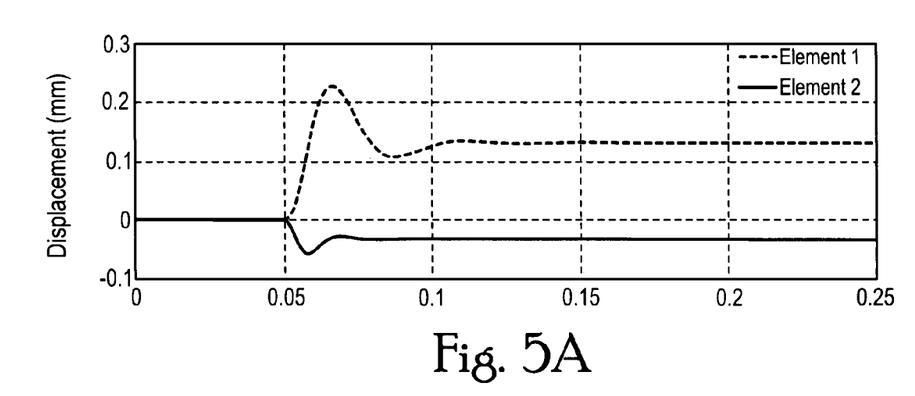
FIG. 5A is a schematic graph of the displacements of two lens elements of a conventional lithographic apparatus in response to a step change in the focus setpoint, the lens elements controlled by a conventional control system.
Figure 5B:
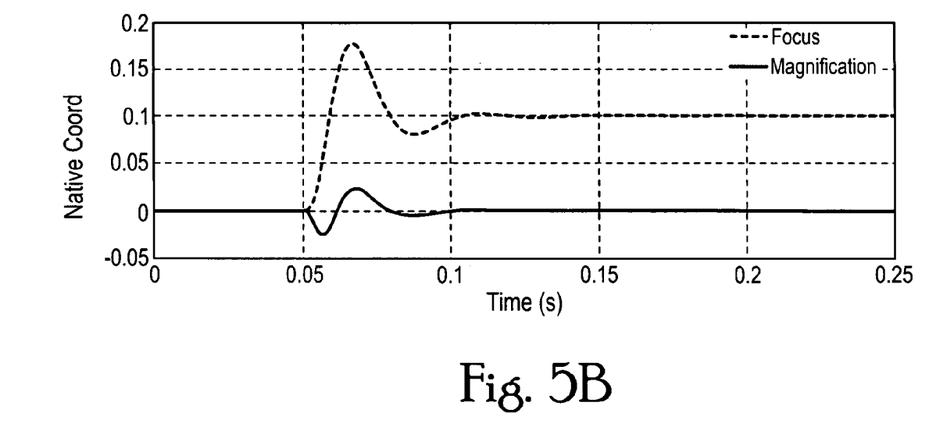
FIG. 5B is a schematic graph of the focus and magnification characteristics of the conventional lithographic apparatus of FIG. 5A.
Figures 5C, 5D:
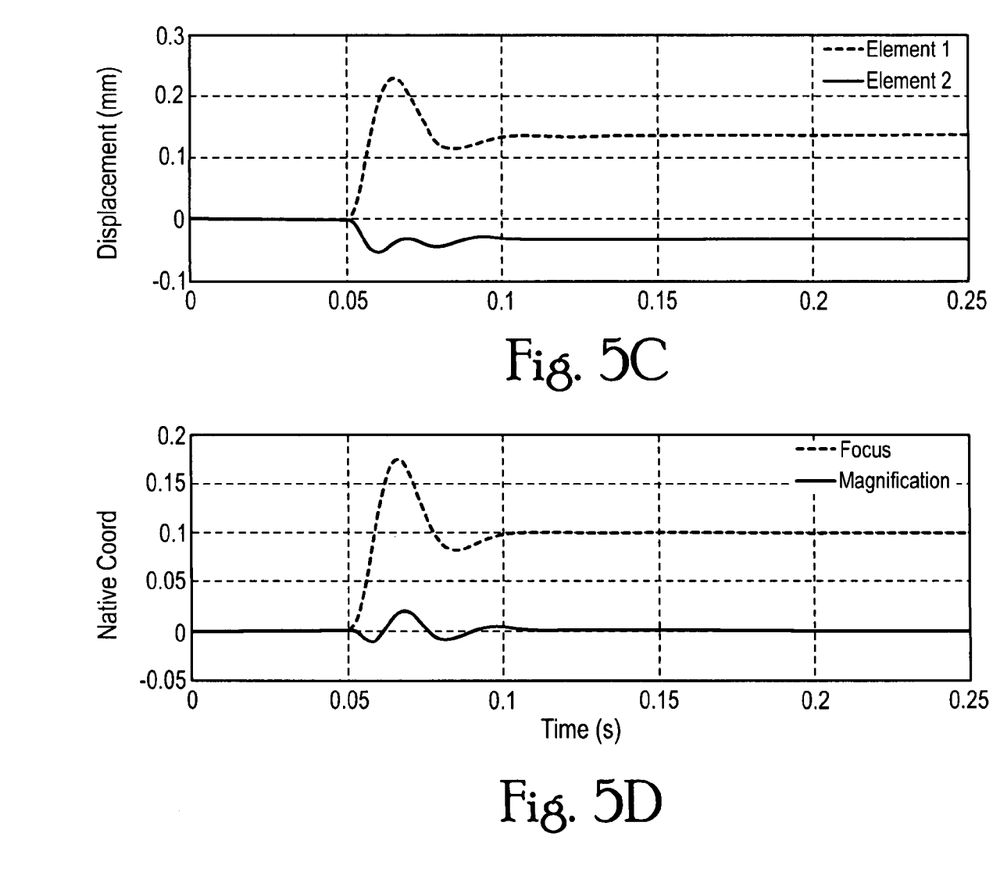
FIG. 5C is a schematic graph of the displacements of two lens elements of a lithographic apparatus according to the present invention in response to a step change in the focus setpoint, the lens elements controlled by two respective SISO native controllers for, respectively, focus and magnification.
FIG. 5D is a schematic graph of the focus and magnification characteristics of the lithographic apparatus of FIG. 5C.
Figure 5E:
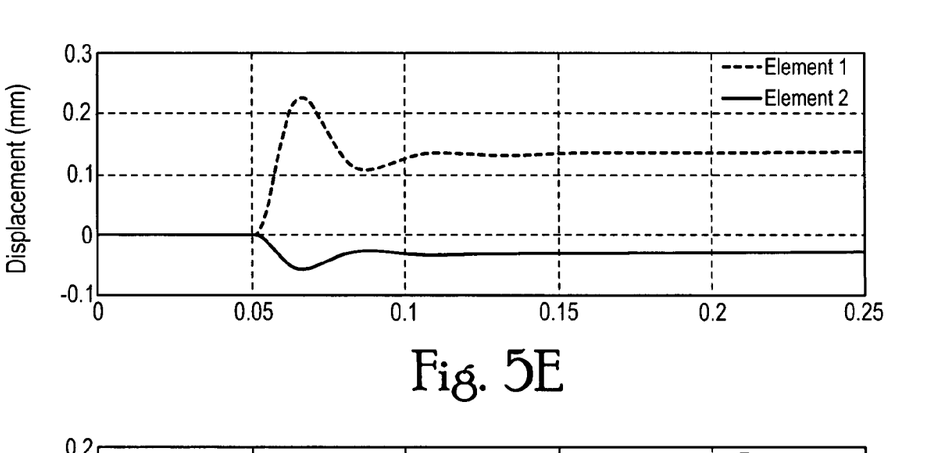
FIG. 5E is a schematic graph of the displacements of two lens elements of a lithographic apparatus according to the present invention in response to a step change in the focus setpoint, the lens elements controlled by MIMO native controllers for both focus and magnification.
Figure 5F:
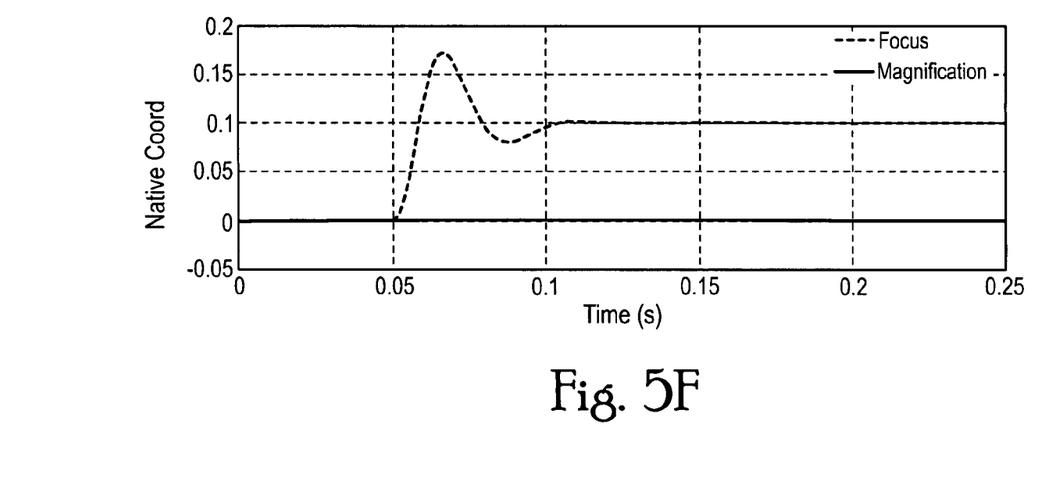
FIG. 5F is a schematic graph of the focus and magnification characteristics of the lithographic apparatus of FIG. 5E.

The focus step response is shown in FIGS. 5A–F. The FIGS. 5A and 5B show the conventional situation with local lens element controllers. The FIGS. 5A, 5C, and 5E show the movement of lens elements 30.1 and 30.2. The FIGS. 5B, 5D, and 5F show the resulting focus and magnification. The FIGS. 5C, 5D show the situation with a SISO focus and a SISO magnification controller. The FIGS. 5E, 5F show the MIMO focus and magnification controller.

It is observed that when using the local lens controllers, a magnification disturbance effect is visible when a focus setpoint is given. Using the focus and magnification controller, the magnification disturbance becomes smaller but it does not vanish. Using the MIMO controller, practically no magnification disturbance is present at all anymore. Hence, a focus setpoint change only results in a focus change without affecting magnification.

Figure 6A:
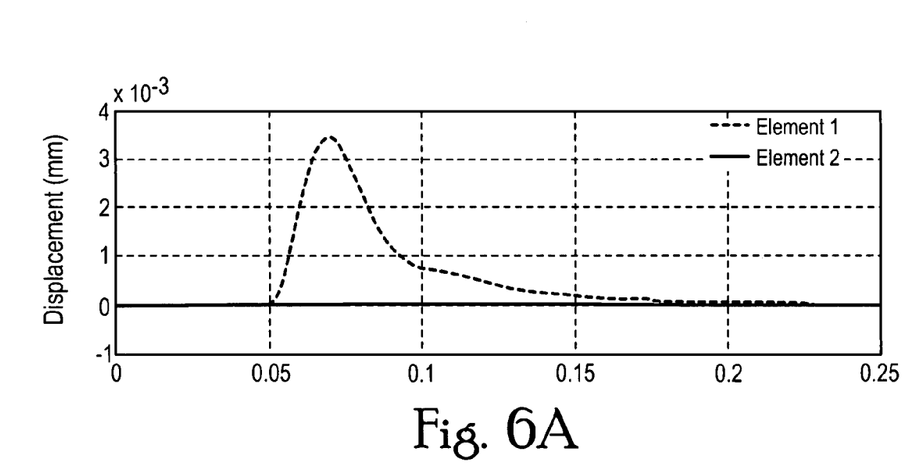
FIG. 6A is a schematic graph of the displacements of two lens elements of a conventional lithographic apparatus in response to a stepwise disturbance applied to a lens element, the lens elements controlled by a conventional control system.
Figure 6B:
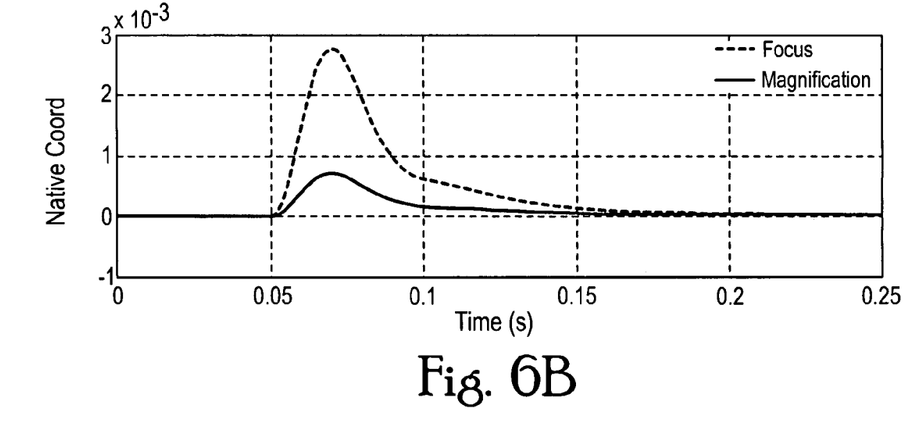
FIG. 6B is a schematic graph of the focus and magnification characteristics of the conventional lithographic apparatus of FIG. 6A.
Figure 6C:
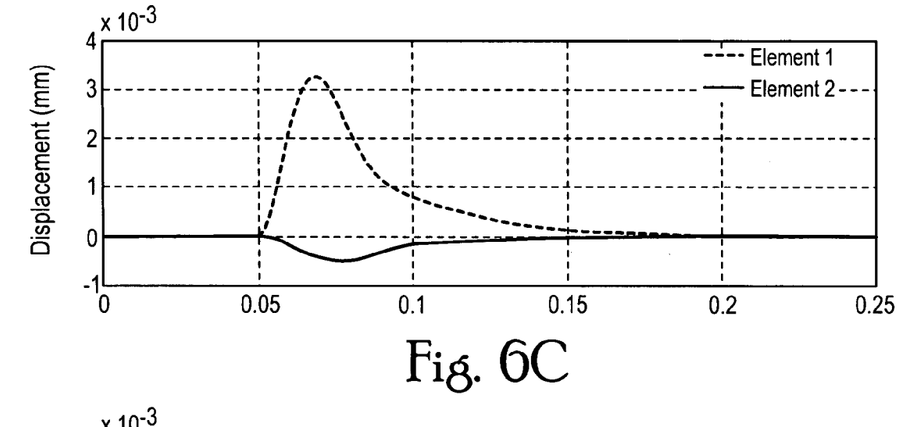
FIG. 6C is a schematic graph of the displacements of two lens elements of a lithographic apparatus according to the present invention in response to a stepwise disturbance applied to a lens element, the lens elements controlled by two respective SISO native controllers for, respectively, focus and magnification.
Figure 6D:
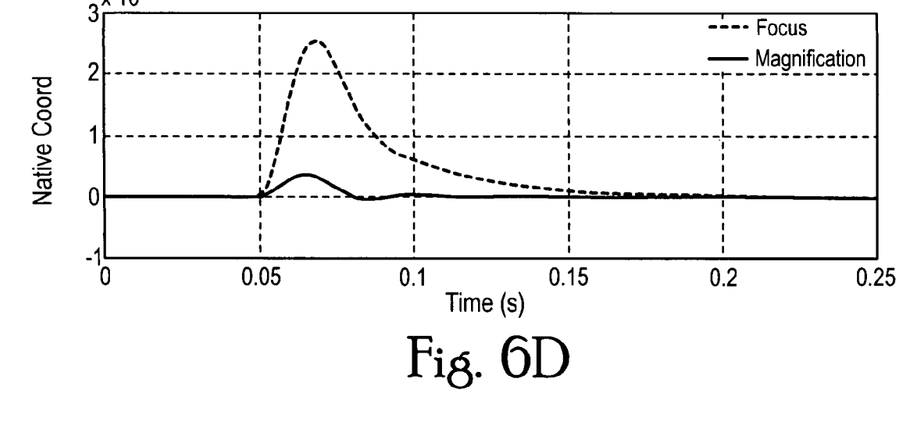
FIG. 6D is a schematic graph of the focus and magnification characteristics of the lithographic apparatus of FIG. 6C.
Figure 6E:
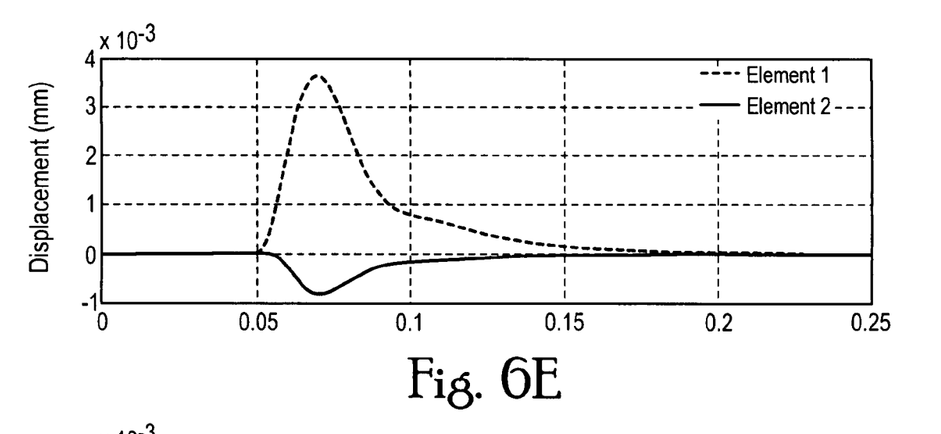
FIG. 6E is a schematic graph of the displacements of two lens elements of a lithographic apparatus according to the present invention in response to a stepwise disturbance applied to a lens element, the lens element controlled by MIMO native controllers for both focus and magnification.
Figure 6F:
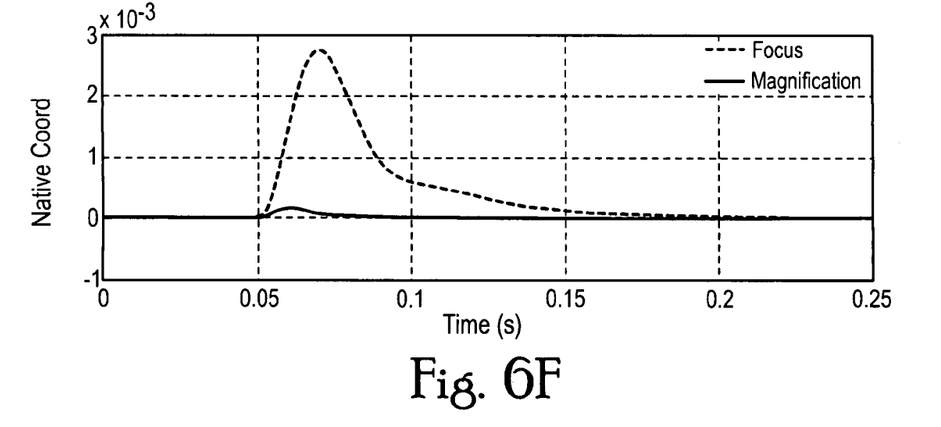
FIG. 6F is a schematic graph of the focus and magnification characteristics of the lithographic apparatus of FIG. 6E.

FIGS. 6A–F show another example of the controller behavior, namely the response to a 1 N stepwise disturbance on lens element 30.1. Using the local controllers, the disturbed lens element 30.1 also effects the magnification, so that a magnification disturbance is also visible (FIG. 6B). This effect is reduced when using the native controllers, especially when using the MIMO controller. It is clearly seen that when using the MIMO controller, lens element 30.2 is moved (FIG. 6E), to minimize the magnification error that was introduced by the disturbance of lens element 30.1 (FIG. 6F).

Figure 7:
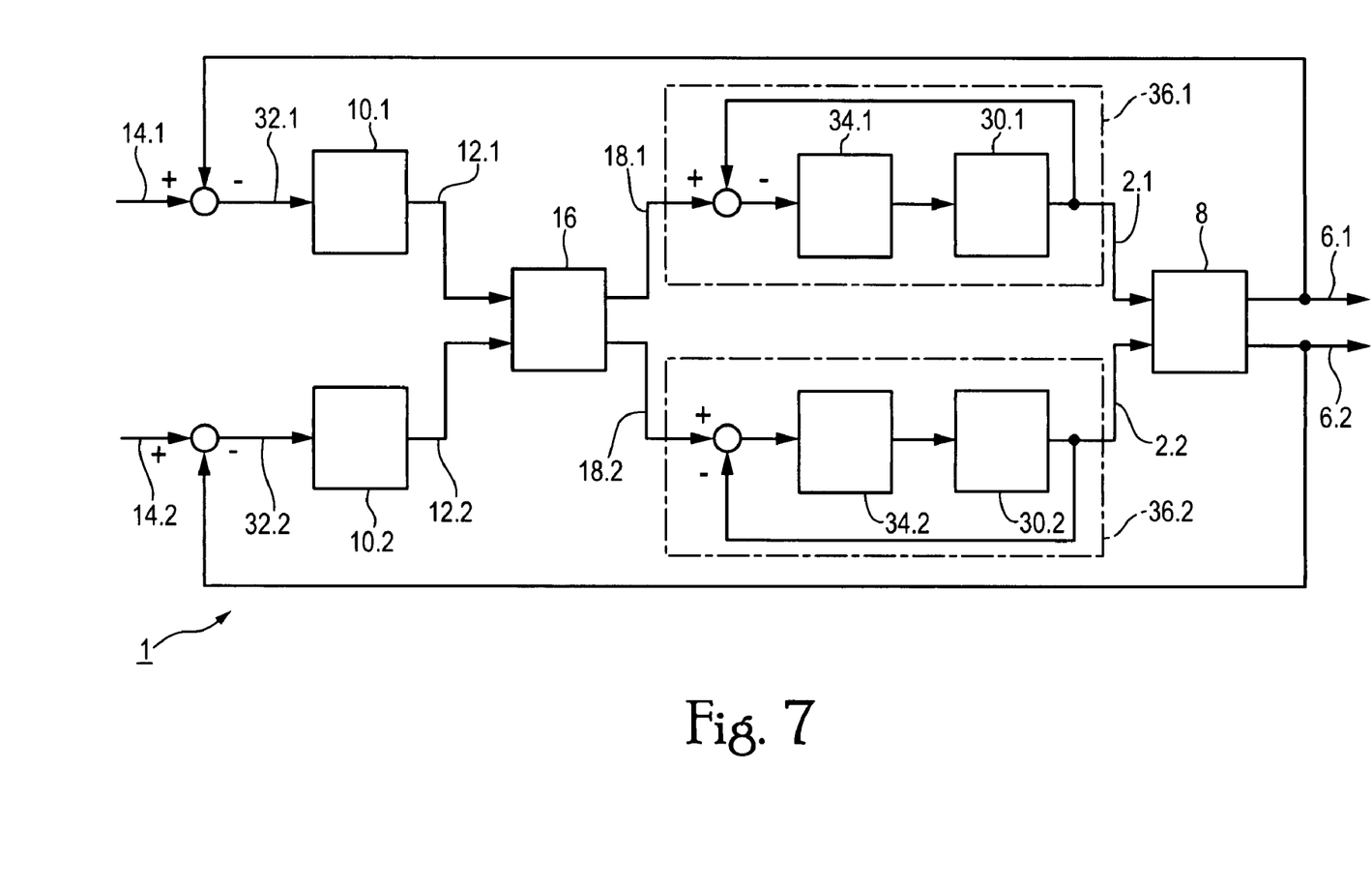
FIG. 7 schematically shows a control system according to the present invention, the control system including two SISO native controllers in cascade with two conventional controllers.
Figure 8:
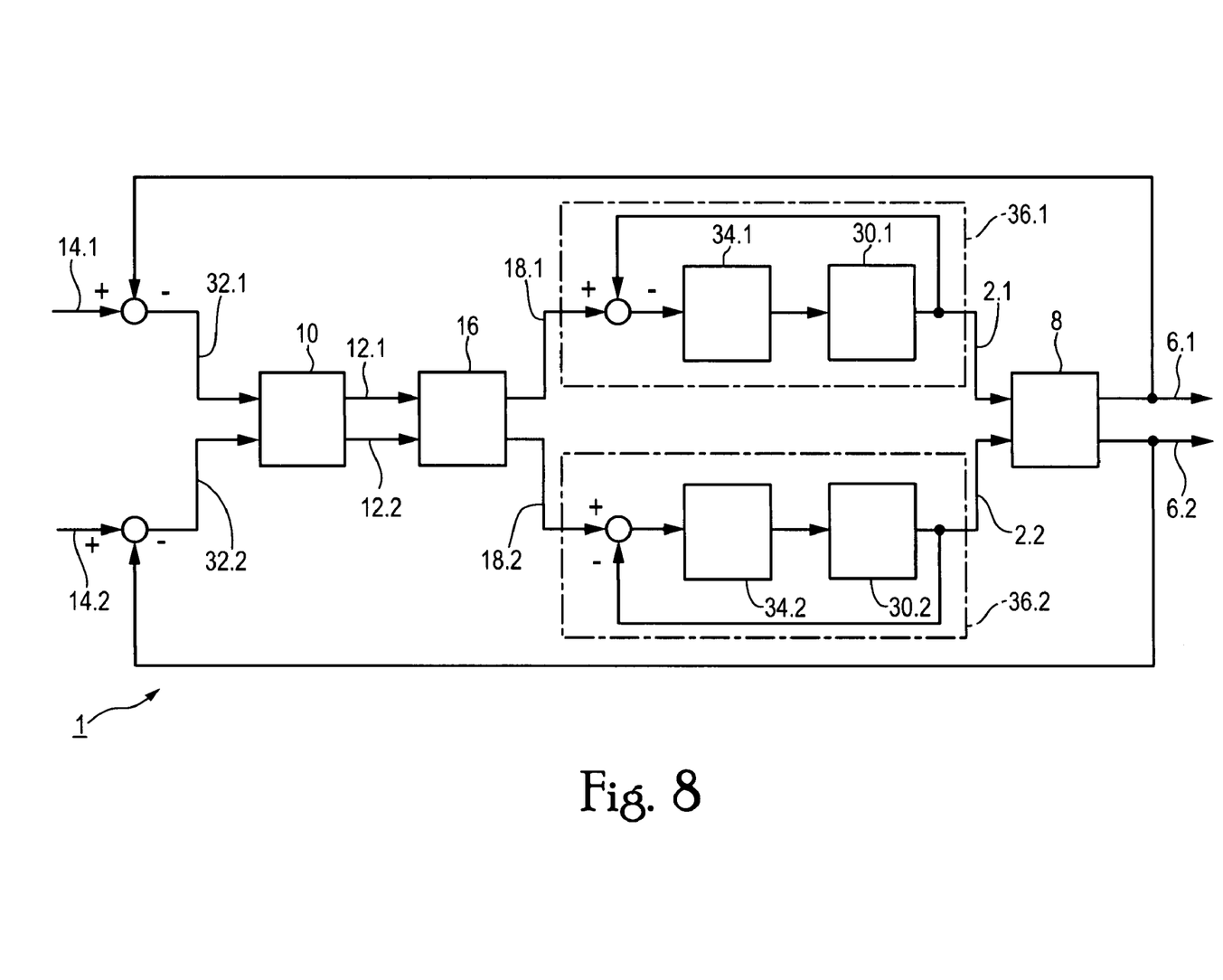
FIG. 8 schematically shows a control system according to the present invention, the control system including a MIMO native controller in cascade with two conventional controllers.

In FIGS. 7 and 8, a cascade of a native controller and a conventional controller is shown. It is mentioned that for various reasons, it may be desired to maintain the conventional or original control loops (such as the loops 36.1 and 36.2) for the lens elements and stages. For example, the controllers may run on different motion controller computers, or the dynamics for the various elements is much more complex than assumed until now. In these occasions, it is desirable to keep the original controllers.

FIG. 7 shows a control system 1 which includes two native SISO (Single-In-Single-Out)-controllers 10.1, 10.2 placed in cascade with two conventional controllers. The two respective controllers 10.1 and 10.2 generate two respective control signals 12.1, 12.2. The control signal (12.1, 12.2) are fed to the transformation unit 16 which calculates a drive signal 18 (including two components 18.1, 18.2). The respective components 18.1 and 18.2 of the drive signal 18 are fed as respective set-point signals into respective conventional controllers 36.1 and 36.2. The conventional controllers operate on conventional position coordinates.

Note that the structure presented in FIG. 7 in the previous paragraph suffers from the same problem discussed previously: the focus and magnification controllers 'see' a non-diagonal system, leading to crosstalk of disturbances. Here also, the solution lies in expanding these controllers to a 2×2 structure (i.e. a 2×2 matrix of controllers), as depicted in FIG. 6.

FIG. 8 shows a control system 1 which includes a MIMO (Multiple-In-Multiple-Out)-controller 10 placed in cascade with two conventional controllers. The controller 10 generates a control signal including two components $12.i$ (i=1, 2). The control signal is fed to the transformation unit 16 which calculates a drive signal including two components 18.1 (i=1,2). The respective components 18.1 and 18.2 of the drive signal 18 are fed as respective set-point signals into respective conventional control loops 36.1 and 36.2. The conventional controllers operate on conventional position coordinates.

Basically, the formulas for calculating the four elements of the controller 10 in FIG. 6 which controller is represented by the 2*2 matrix $C_{FM}$, can be the same as explained in relation to FIG. 4. However, instead of the matrix L which denotes the lens mechanics, a matrix of closed-loop lens transfer functions, P, has to be applied: $C_{FM}=TP^{-1}T^{-1}PS$. Hence, the matrix P of closed-loop transfers has to be calculated, which method is somewhat more complicated than the method discussed in relation to FIG. 4.

Some remarks are made in relation to the embodiments discussed above.

First, the matrix T need not be constant, it could be dependent on external factors, like illumination settings (NA, sigma, etc.) and lens heating effects. If T is updated according to these factors (as long as they are known), no setpoint adjustments are required. For example, consider lens heating. Based on a thermal model of the lens and known reticle and illumination parameters, the system focus is known to drift. In fact, the matrix T drifts. So, alternatively T could be adjusted based on the lens heating model, while the focus, magnification and other imaging characteristics setpoints remain the same.

Second, more intelligence could be built in the native controllers. For example, assume one of the lens elements is disturbed by some force, as described previously. This lens element disturbance leads to a combination of focus, magnification and other imaging characteristics errors. Only bringing this one lens element back to its desired position solves this particular combination of errors. However, a 'higher intelligence' could decide that a focus error has a relatively larger importance than, e.g., a magnification error. This 'higher intelligence' could then decide to solve the focus problem quickly, by using other lens elements that, for example, have a higher control bandwidth, at the cost of a magnification error. In a basic form, this principle was already mentioned in one of the preceding paragraphs, mentioning that the bandwidth of the focus and magnification controllers could be an indication of their relative importance. A more elaborate version would evaluate a criterion that is a function of the native parameter errors (focus, etc.), and dynamically adjust lens elements such that the criterion is minimized.

Third, it is possible that more moveable lens elements are present than there are native controllers to be controlled. In such a case, the extra available degrees of freedom can be used to minimize the effect of disturbances on one of the other lens elements. The end result can be better than without the extra lens element(s).

Fourth, it is similarly possible that less moveable lens elements are present than there are native coordinates to be controlled. In such a case, the controller 10 has more inputs than outputs, and can be designed such that an optimal performance is obtained in the face of a too low number of moveable lens elements to create a wanted behavior.

Fifth, it should be noted that in the described embodiments no feedforwards were included. These feedforwards normally are present to minimize a controller error during the movement of an object. Similar to changing the controller coordinates from conventional positions to native coordinates, the coordinates used by the feedforwards can be changed to native coordinates as well. It is also possible to change only the feedforwards to native coordinates and leave the position controllers operating in conventional coordinates.

The native controller strategy has two main advantages:
1. An error in one of the elements that contributes to an error in a particular characteristic (e.g. focus) can be (partly) corrected by adjusting other lens elements, to keep the overall imaging performance optimal;
2. During a setpoint change of one of the native co-ordinates (focus etc.), the MIMO controllers result in zero error of the other co-ordinates. For example, a focus change results in zero magnification error during movement of the elements.

While specific embodiments of the invention have been described above, it will be appreciated that the present invention may be practiced otherwise than as described. The description is not intended to limit the present invention.

What is claimed is:

1. A lithographic apparatus, comprising:
   an illumination system configured to provide a beam of radiation;
   a support configured to support a patterning device, the patterning device configured to impart the beam with a pattern in its cross-section;
   a substrate table configured to hold a substrate;
   a projection system configured to project the patterned beam onto a target portion of the substrate;
   a measurement system configured to generate an information signal including information about a position of either the patterning device, or the substrate, or the projection system, or a component of the projection system, or any combination thereof; and
   a control system configured to transform the information signal into at least a native feedback signal representing an imaging characteristic of the lithographic apparatus, said control system configured to generate a control signal on the basis of a native set-point signal and the native feedback signal, the control system controlling said position on the basis of the control signal.

2. A lithographic apparatus according to claim 1, wherein the control system comprises a native feedforward controller configured to generate a feedforward control signal on the basis of the native set-point signal, the control signal being determined by the feed forward control signal.

3. A lithographic apparatus according to claim 1, further comprising:
   an actuator configured to exert control forces on at least one of the support, the substrate table, the projection system, and/or a component of the projection system on the basis of the control signal.

4. A lithographic apparatus according to claim 1, wherein the projection system comprises a first lens element having a first position and a second lens element having a second position, the respective first and second positions each controlled by the control system.

5. A lithographic apparatus according to claim 1, wherein the control system comprises a native controller, said native controller comprising single-input-single-output controller.

6. A lithographic apparatus according to claim 5, wherein the native controller comprises a second single-input-single-output controller configured to generate a second control signal, wherein the bandwidth of the respective controllers is chosen according to the relative weight of the native coordinates.

7. A lithographic apparatus according to claim 5, wherein the native controller comprises a multiple-input-multiple-output controller configured to generate at least two control signals.

8. A lithographic apparatus according to claim 1, wherein the control system comprises a conventional controller configured to operate on conventional coordinates, and a native controller connected in cascade with the conventional controller.

9. A control system for a lithographic apparatus including an illumination system configured to provide a beam of radiation; a support configured to support a patterning device, the patterning device configured to impart the beam with a pattern in its cross-section; a substrate table configured to hold a substrate; a projection system configured to project the patterned beam onto a target portion of the substrate; a measurement system configured to generate an information signal including information about a position of either the patterning device, or the substrate, or the projection system, or a component of the projection system, or any combination thereof, the control system comprising:
   a controller configured to transform the information signal into at least a native feedback signal representing an imaging characteristic of the lithographic apparatus, said controller configured to generate a control signal on the basis of a native set-point signal and a native feedback signal, said controller controlling said position on the basis of the control signal.

10. A device manufacturing method for manufacturing a device with a lithographic apparatus, the method comprising:
    projecting a patterned beam of radiation onto a target portion of a substrate;
    generating an information signal including information about a position of either a patterning device used to pattern the beam of radiation, or a substrate, or a projection system used to project the patterned beam, or a component of the projection system, or any combination thereof;
    transforming the information signal into at least a native feedback signal representing an imaging characteristic of the lithographic apparatus;
    generating a control signal on the basis of a native set-point signal and the native feedback signal; and
    controlling said position on the basis of the control signal.

11. A method according to claim 10, further comprising:
    exerting control forces on at least one of a support for the patterning device, a substrate table for the substrate, the projection system and/or a component of the projection system.

12. A method according to claim 10, wherein the projection system includes a first lens element having a first position and a second lens element having a second position, the method further comprising:
    controlling the first and second positions.

13. A lithographic apparatus according to claim 1, wherein the imaging characteristic includes at least one of focus, magnification and/or distortion.

14. A controls system according to claim 9, wherein the imaging characteristic includes at least one of focus, magnification and/or distortion.

15. A method according to claim 10, wherein the imaging characteristic includes at least one of focus, magnification and/or distortion.

* * * * *